United States Patent
Novozhilov et al.

(10) Patent No.: US 11,584,988 B2
(45) Date of Patent: *Feb. 21, 2023

(54) SOLID PRECURSOR FEED SYSTEM FOR THIN FILM DEPOSITIONS

(71) Applicant: MetOx Technologies, Inc., Houston, TX (US)

(72) Inventors: Mikhail Novozhilov, Houston, TX (US); Alex Ignatiev, Houston, TX (US)

(73) Assignee: MetOx Technologies, Inc., Houston, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 17/486,352

(22) Filed: Sep. 27, 2021

(65) Prior Publication Data

US 2022/0010425 A1 Jan. 13, 2022

Related U.S. Application Data

(63) Continuation of application No. 16/756,463, filed as application No. PCT/US2019/068194 on Dec. 21, 2019, now Pat. No. 11,162,171.

(60) Provisional application No. 62/817,909, filed on Mar. 13, 2019.

(51) Int. Cl.
| | | |
|---|---|---|
| *C23C 16/18* | (2006.01) | |
| *C23C 16/448* | (2006.01) | |
| *C23C 16/455* | (2006.01) | |
| *C23C 16/48* | (2006.01) | |

(52) U.S. Cl.
CPC .......... *C23C 16/18* (2013.01); *C23C 16/448* (2013.01); *C23C 16/45561* (2013.01); *C23C 16/482* (2013.01)

(58) Field of Classification Search
CPC ........... C23C 16/448; C23C 16/45561; C23C 16/4485; C23C 16/4481; C23C 16/442; C23C 14/246; C23C 14/54; B05B 7/1445; H01L 39/2438
See application file for complete search history.

(56) References Cited

U.S. PATENT DOCUMENTS

| | | | |
|---|---|---|---|
| 5,764,849 A * | 6/1998 | Atwell | C23C 16/16 |
| | | | 392/386 |
| 5,820,678 A | 10/1998 | Hubert | |
| 6,274,191 B1 | 8/2001 | Emken | |
| 6,338,873 B1 | 1/2002 | Paw | |
| 6,663,713 B1 | 12/2003 | Robles | |
| 7,423,311 B2 | 9/2008 | Ahn | |

(Continued)

FOREIGN PATENT DOCUMENTS

| | | |
|---|---|---|
| WO | 2006021850 A3 | 3/2006 |
| WO | 2011133715 A1 | 10/2011 |

OTHER PUBLICATIONS

International Search Report and Written Opinion issued in relation to International Application No. PCT/2019/068194.

(Continued)

*Primary Examiner* — Joseph A Miller, Jr.

(57) ABSTRACT

A dry powder MOCVD vapor source system is disclosed that utilizes a gravimetric powder feeder, a feed rate measurement and feeder control system, an evaporator and a load lock system for continuous operation for thin film production, particularly of REBCO type high temperature superconductor (HTS) tapes.

9 Claims, 11 Drawing Sheets

(56) References Cited

U.S. PATENT DOCUMENTS

| | | |
|---|---|---|
| 7,910,155 B2 | 3/2011 | Lee |
| 8,124,170 B1 | 2/2012 | Ignatiev |
| 8,268,386 B2 | 9/2012 | Selvamanickam |
| 2003/0006250 A1 | 9/2003 | Tapphorn |
| 2004/0023810 A1 | 2/2004 | Ignatiev |
| 2004/0131773 A1 | 7/2004 | Selvamanickam |
| 2005/0163644 A1 | 7/2005 | Thieme |
| 2005/0223983 A1 | 10/2005 | Selvamanickam |
| 2005/0223984 A1 | 10/2005 | Selvamanickam |
| 2007/0104864 A1 | 5/2007 | Boroson |
| 2008/0103052 A1 | 5/2008 | Ignatiev |
| 2012/0318196 A1 | 12/2012 | Ignatiev |
| 2015/0114296 A1 | 4/2015 | Forrest et al. |

OTHER PUBLICATIONS

"Single Step Fabrication of Nanolamellar Structured Oxide Ceramic Coatings by Metal-Organic Chemical Vapor Deposition", Eils et al., Jrnl of Nanosceience and Nanotechnology, vol. 11, 8396-8401, 2011.

"LuBa2Cu3O7-x Thin Films Prepared Using MOCVD", Samoylenkov et al., J. Mater. Chem., vol. 6 (4), 623-627, 1996.

\* cited by examiner

SOLID PRECURSOR FEED SYSTEM FOR THIN FILM DEPOSITIONS

CROSS REFERENCE TO RELATED APPLICATIONS

This application is a continuation of U.S. patent application Ser. No. 16/756,463 filed Apr. 15, 2020, which is a national stage application of PCT application No. PCT/US19/68194 which claims priority and benefit from U.S. Provisional Patent Application No. 62/817,909 filed on Mar. 13, 2019. The entire contents of each application listed above are of which is incorporated in their entirety herein by reference.

BACKGROUND OF THE INVENTION

Technical Field

Embodiments of the subject matter disclosed herein generally relate to systems and methods for supplying powdered materials to a vapor deposition reactor and more particularly for fabricating high-temperature superconductors from solid precursor materials.

Discussion of the Background

In vapor deposition processing, particularly high temperature superconductor fabrication via MOCVD processing, there is a need to accurately deliver to the reactor deposition chamber precise and tightly controlled quantities of precursor materials. Most common MOCVD precursors for oxide superconductor deposition are solid at room temperature with low vapor pressures and require elevated temperatures in order to achieve evaporation typically in the range of approximately 150-300 C. Early approaches for generating precursor vapor utilized bubblers with dissolved or suspended solid precursors but were difficult to use and required exposure to high temperatures for an extended period of time, which caused degradation of the compounds and was plagued by highly variable and unpredictable vapor delivery rates.

Oxide superconductor MOCVD processing using precursor vapors generated by the flash evaporation approach began in the early 1990s. When flash evaporated, the bulk of precursor material is kept at room temperature, which preserves its properties, and small portions of the bulk material are sequentially evaporated. Historically, the first implementation of the flash evaporation approach was the aerosol MOCVD vapor source [Langlet 1989]. One or several precursor powders were dissolved in an organic solvent and this solution was nebulized and fed into a heated evaporator in aerosol form. This solution-based approach was subsequently improved by directly injecting liquid solution into the evaporator [Felten 1995]. This technique is currently used commercially for second generation (2G) high-temperature superconductor (HTS) wire production but suffers from a number of drawbacks. Firstly, condensation of precursor within the evaporation and delivery system can lead to fouling, plugging and variable delivery to the reaction zone, as well as loss of expensive precursor material. To obviate these issues, the entire CVD delivery system must typically be insulated and heated with heat tape or other means. Further, large quantities of solvent vapor generated along with the precursor vapor is known to be a potential problem in the deposition process, particularly for REBCO (to be discussed later) type superconductors.

Therefore, several implementations of solvent free dry MOCVD vapor sources were developed over the years: band flash evaporation sources [Kaul 1993; Klippe 1995]; solid source based on a vibratory feeder [Samoylenkov 1996]; solid source based on a grinder feeder [Hubert et. al., U.S. Pat. No. 5,820,678]; and solid source based on a volumetric feed screw type feeder [Eils 2011]; while others developed approaches to mechanically meter the powder feed, [e.g. Long et. al., U.S. Pat. No. 8,101,235] to further improve the performance of a volumetric type feeder. These solid source approaches have their own set of drawbacks. For example, self-segregation of particles and vortexing of powder within the powder hopper and other detractions can cause highly variable powder delivery rates that are difficult to control and predict.

High temperature superconductor thin film texture, growth rate, and final conductor performance characteristics are particularly sensitive to factors related to the precursor delivery system. Materials having superconducting properties at liquid nitrogen temperature (77K) include $YBa_2Cu_3O_{7-x}$ (YBCO) as one of a group of oxide-based superconductors called high temperature superconductors (HTS). High temperature superconductors provide the potential for development of superconductor components at higher operating temperatures compared to traditional superconductors that operate at liquid helium temperature (4.2K). Superconductors operating at the higher temperatures enable the ability to develop superconducting components and products more economically. After the initial discovery of YBCO superconductors, other superconductors were discovered having a similar chemical composition but with Y replaced by other rare earth (RE) elements. This family of superconductors is often denoted as REBCO where RE may include Y, La, Nd, Sm, Eu, Gd, Tb, Dy, Ho, Er, Tm, Yb or Lu.

There are several methods for the deposition of REBCO type thin films in the manufacturing of REBCO wire including metal organic chemical vapor deposition (MOCVD), pulsed laser deposition (PLD), reactive co-evaporation (RCE), and metal organic deposition (MOD). Many methods within the category of physical vapor deposition (PVD) techniques suffer from generally low growth rates; a requirement for high vacuum; need for continual source change-out; moderate area coverage and a restriction to only line-of-sight deposition. Such limitations, especially the low growth rates, are problematic for the economically viable commercialization of the YBCO film technology for HTS wires and tapes. MOCVD with highly controlled precursor delivery can overcome many of these drawbacks and produce high quality thick superconducting YBCO thin films for coated conductor applications.

MOCVD technology has been directly applied to YBCO film growth and has shown the capability for fabrication of high quality YBCO through modification of traditional semiconductor MOCVD for higher temperatures, oxidizing atmospheres and lower vapor pressure precursors (Zhang et. al.). The higher temperatures (more than 200K higher than that used for semiconductor III-V compound MOCVD) require improved reactor designs and improved heaters, and the lower vapor pressure precursors require enhanced attention to precursor vapor flow control and stability. The initial results were promising, and for YBCO films grown on single crystal oxide substrates Tc>90K and Jc>$10^6$ A/cm$^2$ were realized (Schulte et al.).

With the discovery of high temperature superconductor (HTS) materials; one of the foci was directed towards the development of HTS wire for high-power electrical applications. Such applications include, but are not limited to, transmission cables, distribution cables, electric motors, electric generators, electric magnets, fault current limiters, transformers, and energy storage. For the HTS wire to be a successful solution for these high-power electrical applications, it needs to meet the high-power electrical requirements of the different applications while being low enough in cost to meet the commercial requirements for these applications.

One of the primary electrical characteristics of interest is the critical current of the HTS wire. The critical current (Ic) is the electrical current at which the superconductor loses its superconducting properties and becomes non-superconducting. The critical current of the superconductor is affected by the temperatures and magnetic fields experienced by the superconductor. The higher the temperature and magnetic field, the lower the critical current. To be able to meet the technical requirements for the variety of applications, the HTS wires will need to have high enough critical currents in the temperatures and magnetic fields experienced by these applications.

One of the key approaches for increasing the critical current carrying capacity of the superconductor is through the introduction of magnetic flux pinning material into the superconductor. At higher magnetic fields, type II superconductors allow magnetic flux to enter in quantized packets surrounded by a superconducting current vortex. These sites of penetration are known as flux tubes. Flux pinning is the phenomenon where free motion of magnetic flux tubes in type II superconductors is inhibited due to their interaction with defects in the superconducting material. A flux tube which is adjacent or encompassing such a defect has its energy altered and its motion through superconducting material is impeded. Flux pinning seeks to take advantage of the dual critical fields that allow penetration of magnetic field lines into type II superconductors and which limit performance characteristics. Increased anisotropy and reduced current carrying capacity results from unpinned flux tubes which aid the permeation of magnetic flux. Flux pinning is thus desirable in high-temperature superconductors to prevent "flux creep", which induces voltage and effective resistance of the conductor and diminishes critical current (Ic) and critical current density (Jc).

Thus, the inclusion of pinning sites or centers that act as magnetic flux pinning centers within the superconductor aid in the improvement of critical current carrying capacity. The pinning centers may be composed of specific compositions of non-superconducting material with specific orientations. Such centers may generally be referred to as pinning sites or centers, flux pinning centers, defects, or defect centers. The presence of these flux pinning centers provides the wire the ability to improve critical currents, even in high magnetic fields.

As with any superconducting wire, one of the key objectives has been to improve the flux pinning properties and in turn, improve the Ic of the REBCO wires. Many processes have been investigated to produce a REBCO superconductor film with nanoparticle inclusions as pinning centers to further improve current capacity. The REBCO fabrication process has been varied to naturally create non-superconducting impurities such as $Y_2O_3$ and $Y_2BaCuO_5$ in specific orientations relative to the superconducting layer to yield improvements in flux pinning and corresponding Ic.

Other materials that are not part of the REBCO group of elements are known to be introduced into the superconductor layer to create the non-superconducting particles. Materials such as $BaMO_3$ where M may be Ti, Zr, Al, Hf, Ir, Sn, Nb, Mo, Ta, Ce, V are added as doping material to create the non-superconducting nanoparticles.

This doping of foreign material combined with the columnar distribution of preferentially c-axis orientated nanoparticles has yielded REBCO wire with improved performance and increased Ic, especially in high magnetic fields, as compared to non-doped material. However, the production methods to produce these nanodots and nanorods are highly complex in order to deposit the doped material in specific super structures (e.g. columns) and orientations relative to the superconductor layer. Difficulties in achieving correct preferential orientation of the doping material restricts the growth rate of the wire which adds production time, and concomitant cost and complexity.

Thus, it is of great value to develop a superconducting article fabrication process with precise and highly controllable precursor delivery system to produce high performance HTS wire that meets the Ic requirements of high-power applications, even at high magnetic fields. It is a further objective to produce a superconductor capable of meeting those requirements at a high growth rate to enable production with commercially attractive economics. Hence, reducing the variability of precursor delivery to the deposition zone that is inherent in current precursor delivery technologies has the potential to achieve high growth rates whilst maintaining desired crystallographic structure and pinning center distribution within the thin film for optimum current carrying capacity even in high magnetic fields.

SUMMARY OF EXAMPLE EMBODIMENTS

According to an embodiment, there is a precursor feed system for deposition of thin films. The system includes a powder feeder assembly with a load lock assembly; a weighing mechanism configured to provide continuous mass data of precursor powder in the powder vessel; a control system; and an evaporator. The control system data processor converts the continuous mass data from the weighing mechanism to a feed screw rate to deliver a target precursor powder feed rate to the evaporator.

According to another embodiment, there is a precursor feed system for deposition of thin films. The system includes a powder feeder assembly; a load lock assembly; a control system; and an evaporator. The control system data processor converts a process variable input to a feed screw rate to deliver a target precursor powder feed rate to the evaporator.

According to yet another embodiment, there is a method for manufacturing a high temperature superconductor. The method includes introducing a substrate to a reactor; providing an evaporator coupled to a precursor powder feed assembly having a screw feed device and a precursor powder vessel coupled to a weighing mechanism; loading a precursor powder to a load lock assembly, wherein the precursor powder is comprised of at least one component of a high temperature thin film superconductor; monitoring the precursor powder vessel weight; controlling the feed screw rate based upon the powder vessel weight in order to provide a target precursor powder feed rate to the evaporator; evaporating the precursor powder in the evaporator; transporting the evaporated precursor into the reactor; and depositing the thin film upon the substrate in the reactor.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION OF EXAMPLES OF THE INVENTION

The following description of the embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to a system for precisely controlled solid precursor delivery for deposition of thin films, particularly superconductor tapes. However, the embodiments discussed herein are not limited to such elements.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the described features, structures or characteristics may be combined in any suitable manner in one or more embodiments.

Many epitaxial growth systems are known in the art to require precise feed of precursor reactants to a vapor deposition reactor including high-temperature superconductors (HTS). Embodiments of the present invention include a precursor feed system capable of precisely controlled delivery of solid phase precursors to a vapor deposition reactor suitable for HTS fabrication and other deposited thin film applications.

Figure 1:
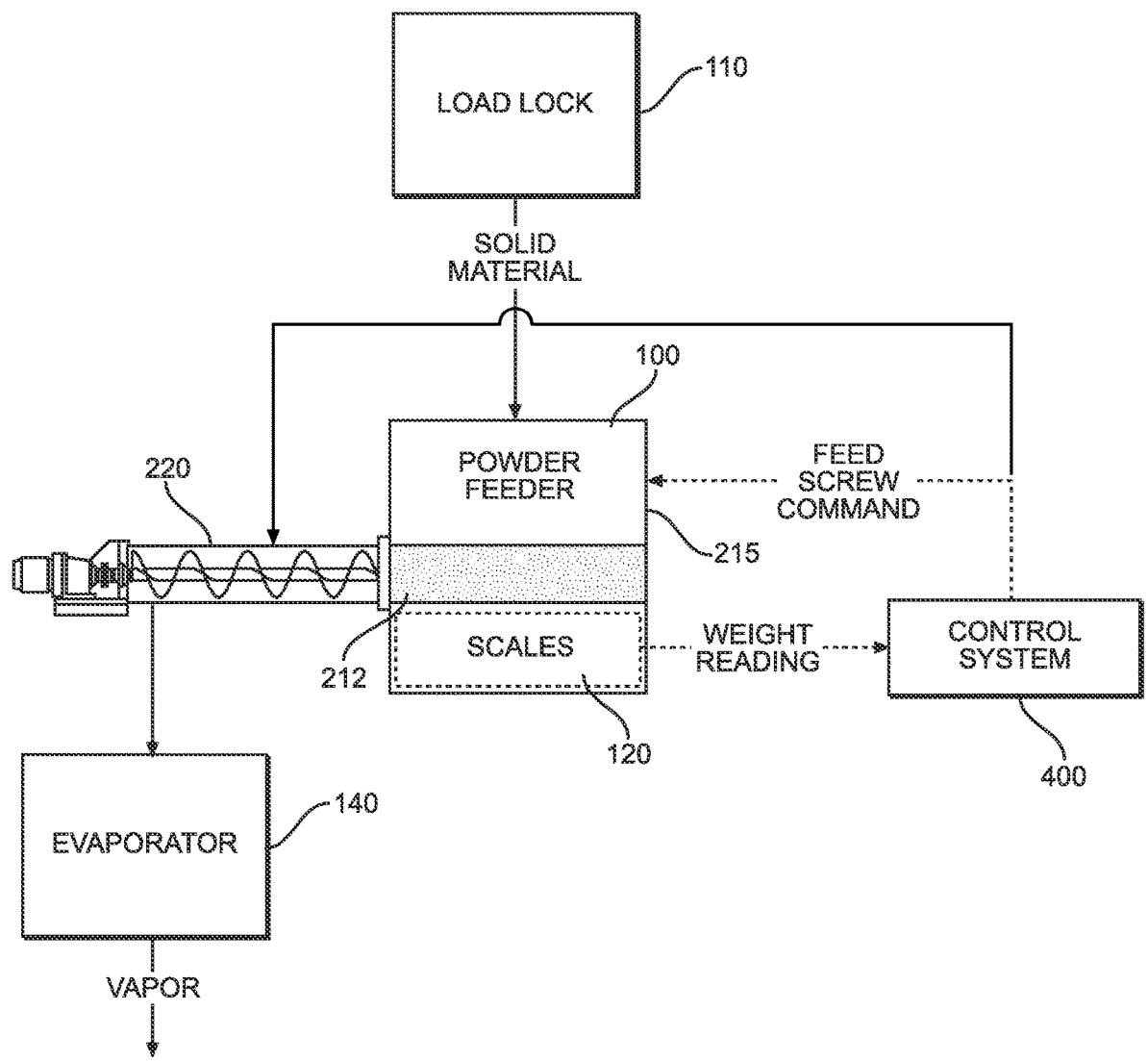
FIG. 1 shows an exemplary powder feed system.

The main components of an exemplary embodiment of the powder precursor feed system are illustrated in FIG. 1. Main feed system components include a powder feeder assembly 100 comprising a feed screw device 220 and a powder vessel 215 for housing a precursor powder 212; a load lock assembly 110 comprising a pressure isolated chamber for reloading the powder feeder assembly powder vessel 215; a weighing mechanism 120 coupled to the powder vessel and configured to provide continuous mass data of precursor powder in the powder vessel; a control system 400 comprising a PID loop and a data processor; and an evaporator assembly 140 configured to receive the precursor powder from the powder feeder assembly and evaporate the powder.

Figure 2:
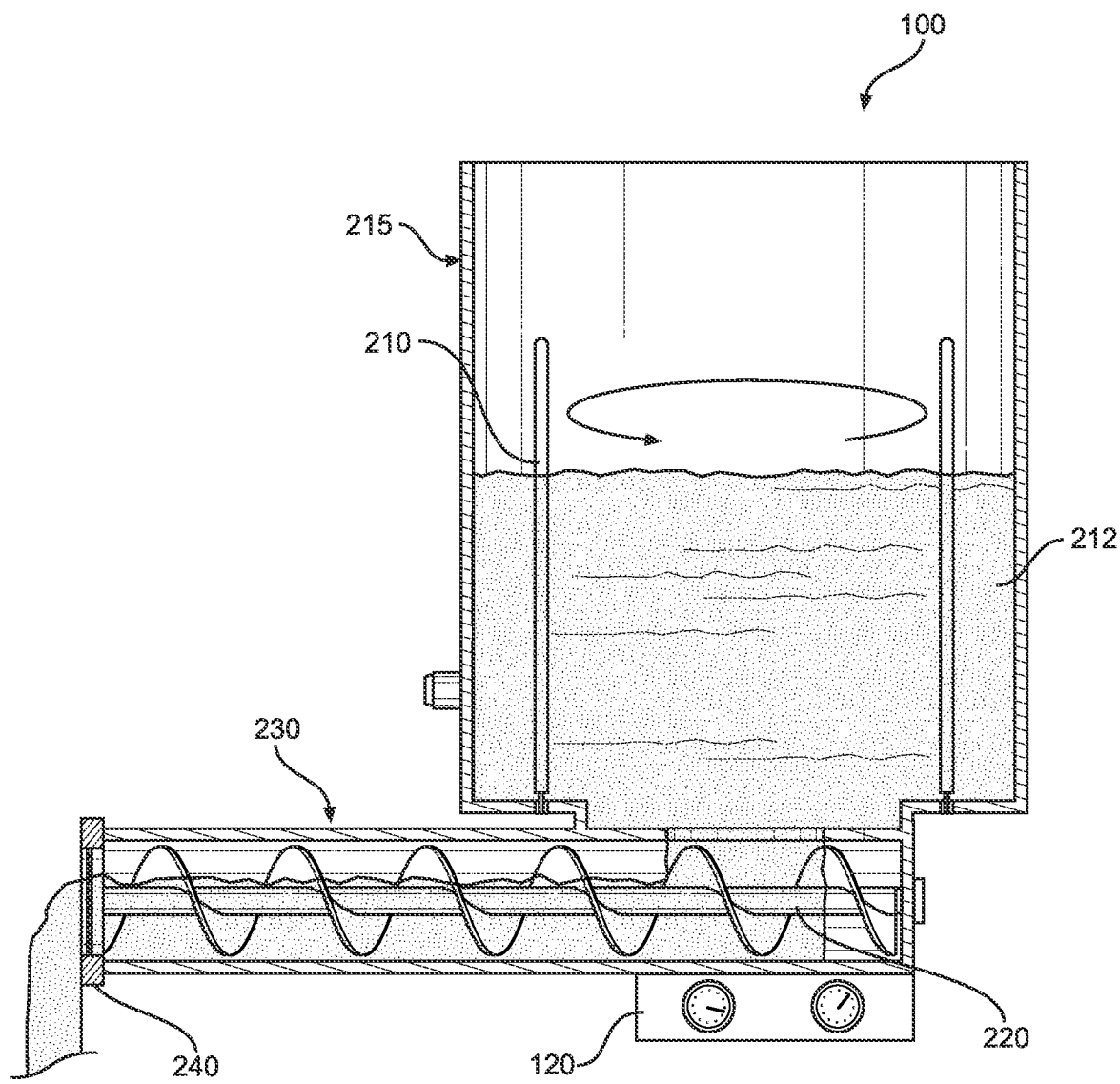
FIG. 2 shows an exemplary powder feed assembly.

FIG. 2 shows an exemplary powder vessel assembly 100 equipped with motor driven agitator 210 located inside a powder vessel 215 for housing the precursor powder 212; a motor driven feed screw 220 set up in horizontal orientation inside a feed screw barrel 230; and an outlet screen 240 at the end of the feed screw barrel 230. A feed screw 220 may take the form of an actual screw or auger but may in the alternative be comprised of other mechanical devices known in the art for powder transmission, e.g a conveyor belt, rotating scraper etc. type device. The outlet screen 240 may take the form of a mesh screen or vibratory device to aid in breakup and distribution of the powder exiting the feed screw 220 into the reactor (not shown, to be discussed later). In preferred embodiments, the solid precursor material is only in contact with stainless steel surfaces, preferably electro-polished to a mirror finish to reduce electrostatic charge that can cause adherence and buildup of powder on the system's surfaces. Feeder performance may be tailored to achieve a target feed rate through proper sizing and tuning of the design of the agitator 210, feed screw barrel 230 ID, pitch and thread count of the feed screw 220 and the size and porosity of the outlet screen 240 for a given solid material's specific powder flow characteristics.

Feeder performance may be degraded by powder vortexing or "rat-holing," and/or bridging of the powder material 212 inside of the powder vessel 215. Also, settling in the powder vessel may densify the powder and overload the feed screw 220 drive motor(s) adversely affecting the feed rate oscillations, particularly at low feed screw RPM's. Thus, the agitator 210 aids in reducing these effects, including auto-segregation of powder particles by size within the powder vessel 215 which can cause a shift in mass delivery over time. Agitators known in the art include internal and external mechanical vibratory devices, rotating barrels with splines, auger solid mixers and other suitable devices.

In certain embodiments, including typical high-temperature superconductors, the thin film deposition process may require more than one solid precursor compound or material 212. For more than one precursor, each compound may have its own feed system, or a mixture of multiple solid precursor compounds may be combined in the same feed system. In other embodiments, separate powder vessels may feed a shared feed screw assembly. If the solid precursor material is a mixture of several powder components; there is also a danger of components separating (or auto-segregating) in the powder vessel and thus the composition of material coming out of the feeder may vary in time. Thus, when precursors are combined in a single powder vessel; auto-segregation by both size and composition can occur. Therefore, in addition to mechanical agitation of the powder vessel, proper pre-conditioning of the solid material 212 loaded into the powder vessel such as pre-mixing, grinding, granulating may be conducted to achieve desired feeder performance.

Figure 3:
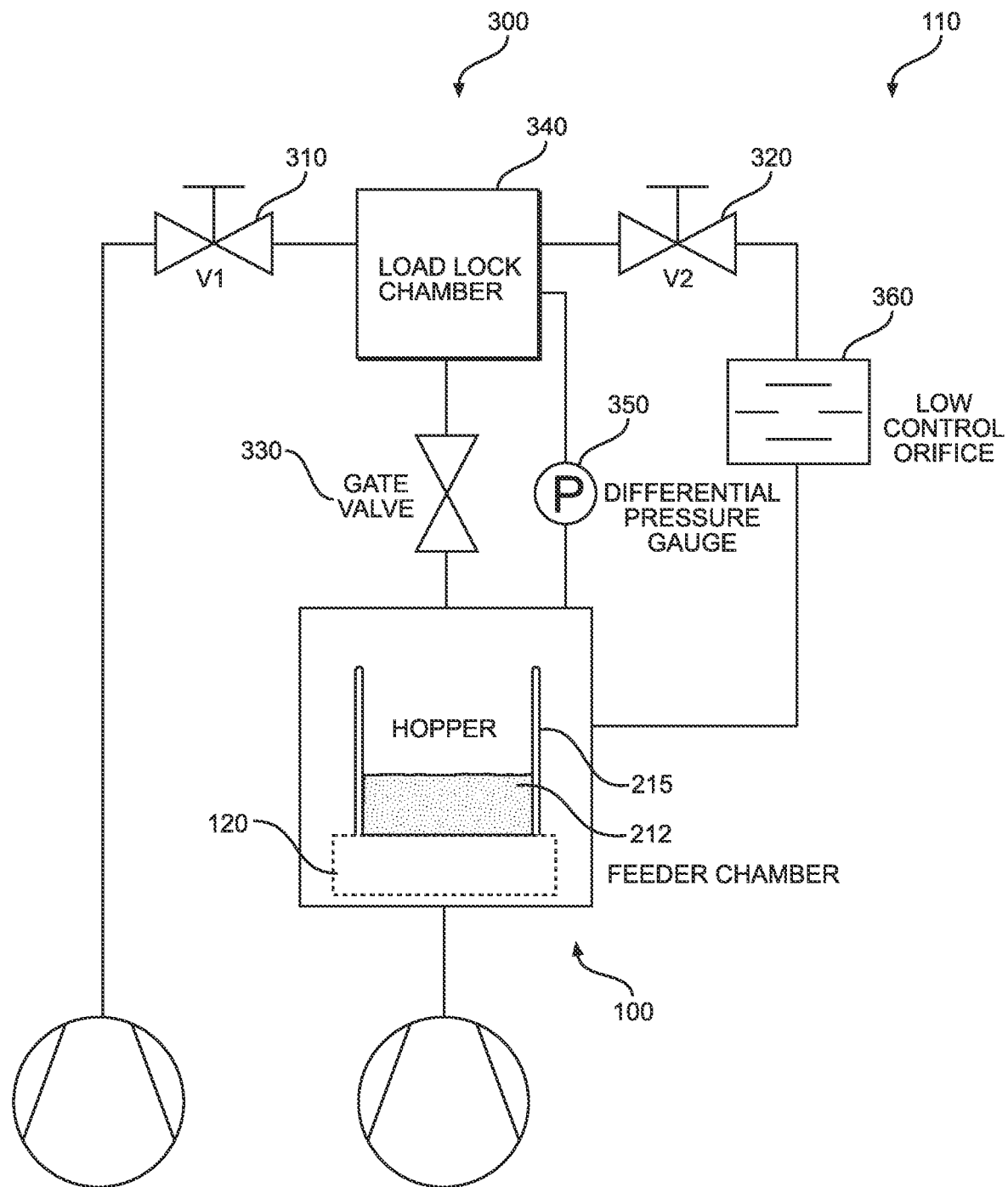
FIG. 3 shows an exemplary load lock assembly.

An exemplary load lock assembly 110 for continuous closed system reloading of the powder vessel 215 is shown in FIG. 3. The assembly provides for reloading of the powder vessel 215 of the powder feeder 100 without breaking the vacuum environment of a low-pressure vapor deposition system such as used in HTS fabrication. Avoiding interruption of the thin film deposition process is essential for continuous operation and production of long length REBCO coated tapes which requires that the vacuum conditions be maintained continuously.

Typical operation of the load lock assembly 110 starts with all three valves shown as valves V1 (310) and V2 (320) and a gate valve 330 closed and the load lock chamber 340 open to the ambient environment. A new load of solid precursor material 212 is added into the load lock chamber 340; the chamber is sealed and evacuated by opening valve V1 (310). Pressure in the lock chamber, as monitored by pressure gauge 350 is reduced until it gets lower than the pressure in the feed system powder vessel 215, at which point V1 (310) is closed. Then V2 (320) is opened and a quantity of process gas is drawn through flow control orifice 360 from the powder vessel 215 into the load lock chamber 340 until the pressure in both chambers is equalized, at which point the gate valve 330 is opened.

Figure 11:
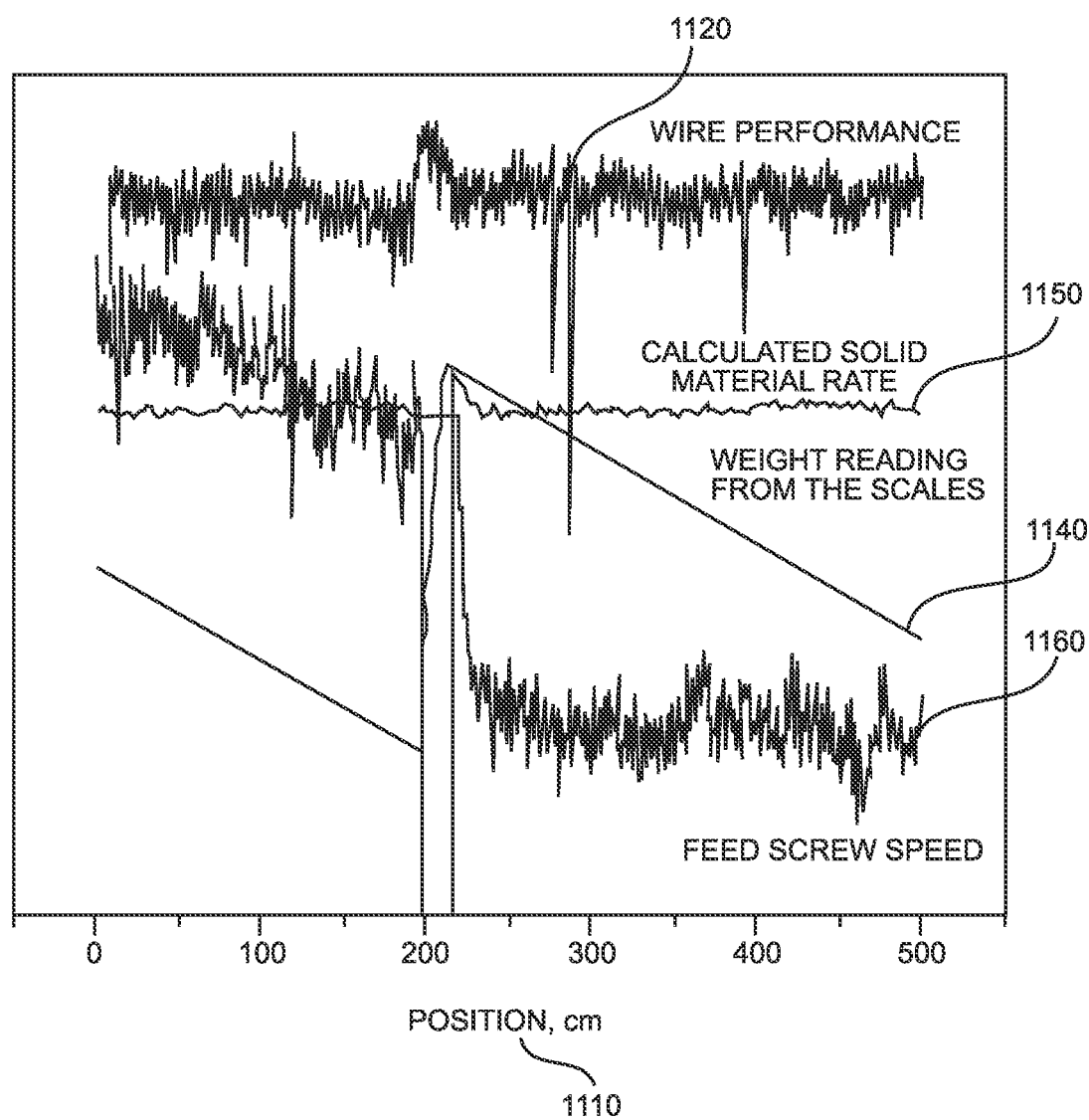
FIG. 11 shows an exemplary plot of the HTS performance vs. position overlaid with powder feed weight control variable.

Before transferring the precursor material 212 from load lock chamber 340 to powder vessel 215, the feeder control system (FIG. 4 discussed below) is switched from closed loop control mode to open loop control mode, in which the feed screw runs at a constant speed. Then the precursor material 212 is gravity fed from the load lock chamber 340 into the powder vessel 215 of the powder feeder assembly 100. The gate valve 330 and valve V2 320 are closed and closed loop control of the feeder is reengaged thus completing the reloading cycle. FIG. 11 to be discussed in greater detail below, graphically plots pertinent controller outputs that further illustrate the reloading sequence.

Returning to FIGS. 1 and 2, in preferred embodiments, the powder feed assembly 100 includes a weighing mechanism 120 coupled to the powder vessel 215 and configured to provide continuous mass data of precursor powder 212 in the powder vessel 215 to a control system 400. The weighing mechanism 120 may comprise a high precision, high-resolution gravimetric scales in contact with or affixed to the powder vessel. Hence in this context, the term "coupled" shall mean herein as in contact with, as either affixed to or by mere contact. Such scales known in the art may be capable of weighing 10's to 100's of grams or several kilograms to a precision of fractions of a gram, and in certain preferred embodiments, to one-thousandth of a gram or less with resolution of 1:4,000,000 or greater. It is also readily contemplated that the entire powder feed system, or individual components thereof including the powder vessel and weighing mechanism, may be in an enclosed housing to minimize drift and error in the measurements.

Figure 4:
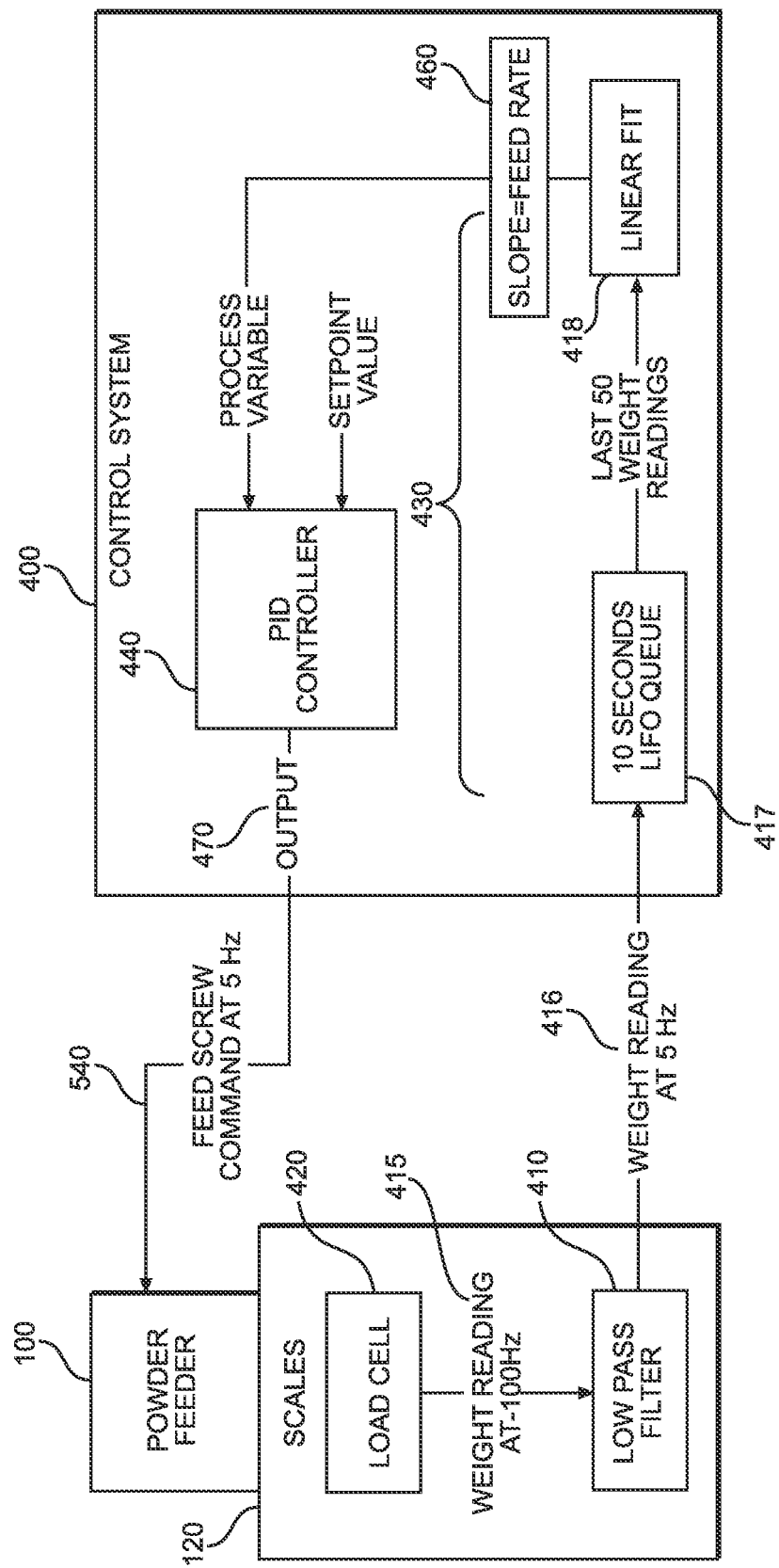
FIG. 4 shows an exemplary control system.

An exemplary closed loop feeder control system is shown in FIG. 4. The high-resolution weighing mechanism 120 provides an input to a controller 400, for example, as a 100 Hz reading 415 processed through a low pass filter 410 from a load cell 420 to generate a 5 Hz weight reading 416. A data processing algorithm 430 and PID control loop 440 are typically implemented as software code running on a programmable automation controller (PAC) 400.

The weight reading input 415 may be in the units of a weight per time from which a powder vessel weight change or loss per unit time, e.g. micrograms powder per millisecond, is calculated by the algorithm 430. The scales 120 may generate multiple weight readings per second which are read and buffered by the PAC. The data 415 as a weight versus time curve (w(t)) may then be filtered 410 to reduce noise and smoothen the w(t) curve 416. The w(t) curve (415, 416) may then be numerically differentiated to calculate the weight loss rate or feed rate curve w'(t) and fit to a curve 418 corresponding to a feed rate. Various numerical schemes may be employed by algorithm 430 to treat or precondition 417 the weight readings, for example, aggregation of 10 seconds of weight values on a "Last In First Out" (LIFO) basis, or alternatively for a 10 second, or other suitable duration, on a "First in First Out (FIFO) basis. Thus, the data processing algorithm 430 may convert a given weight loss 415, 416 curve to a linear or other fitted parametrized curve or formula 418 to generate a calculated feed rate 460.

This calculated feed rate 460 may be used as process control variable input into the PID control loop 440. Output from the PID loop 470 may then be used as a speed command 540 for the motor driving the feed screw 220. Performance of the control system 400 can be optimized by adjusting parameters which are used to filter raw weight readings and differentiate the w(t) curve as well as tuning the gains of the PID loop 440.

Figure 5:
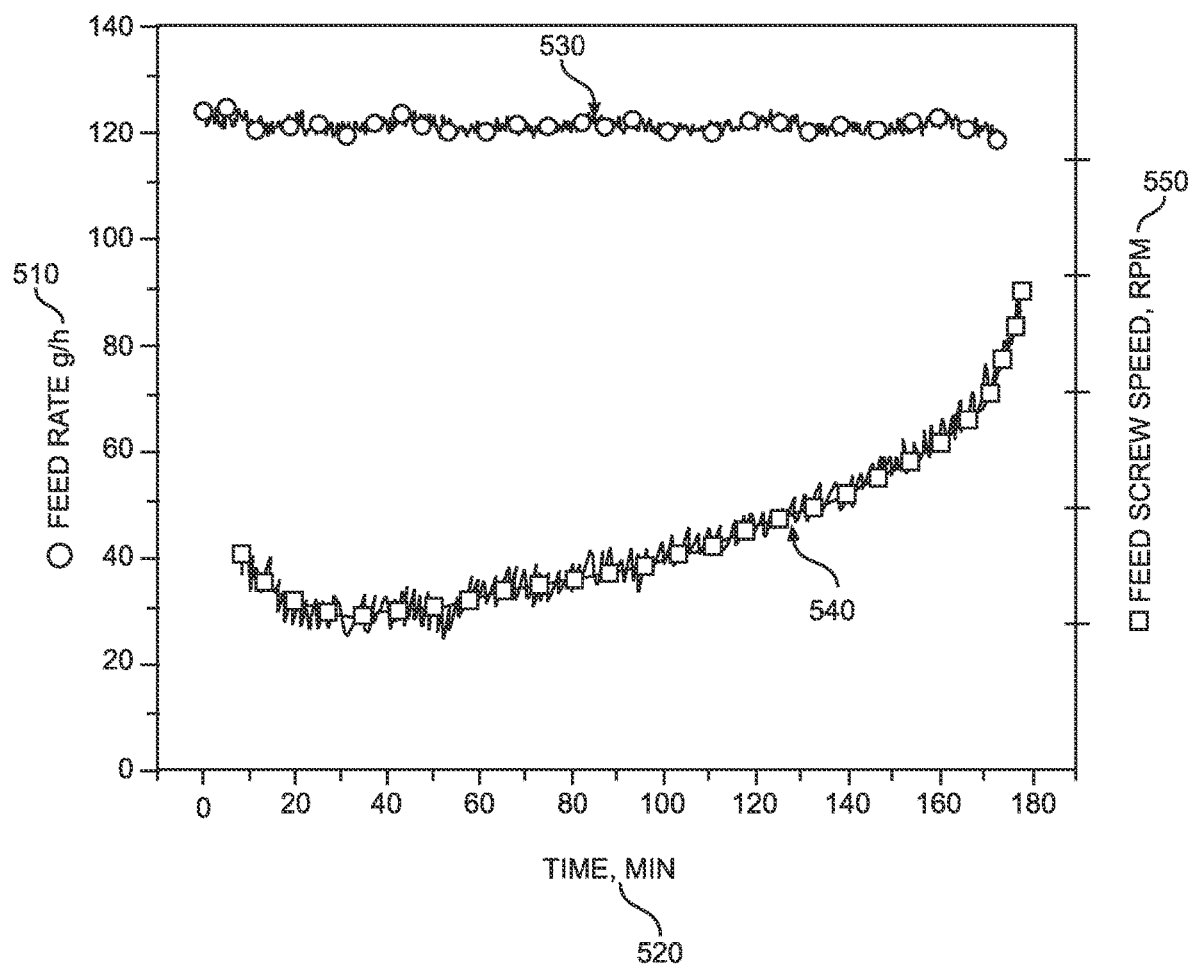
FIG. 5 shows an exemplary plot of the performance of the actual feed rate vs. time for a given target.

FIG. 5 shows an exemplary plot of the performance of the actual feed rate 530 vs time 520 for a given target or setpoint 510 (left hand y-axis) of 120 g/h resulting from a feed screw rate curve 540 (right hand y-axis 550) calculated by the programmable controller. In this example, the PID loop 440 of the control system 400 controls the feed screw rate 540 which is increased over time to compensate for changes in the powder feed vessel 215 mass over time that occurs over time in between recharges of precursor material into the load lock assembly 110. As the powder vessel 215 weight changes over time, the feed screw speed 540 is automatically adjusted by the PAC 430 in order to maintain a tightly controlled actual feed rate 530 that agrees closely with a setpoint or target 510, in this example, with less than 1% coefficient of variability (CV) actual vs setpoint.

Figure 6:
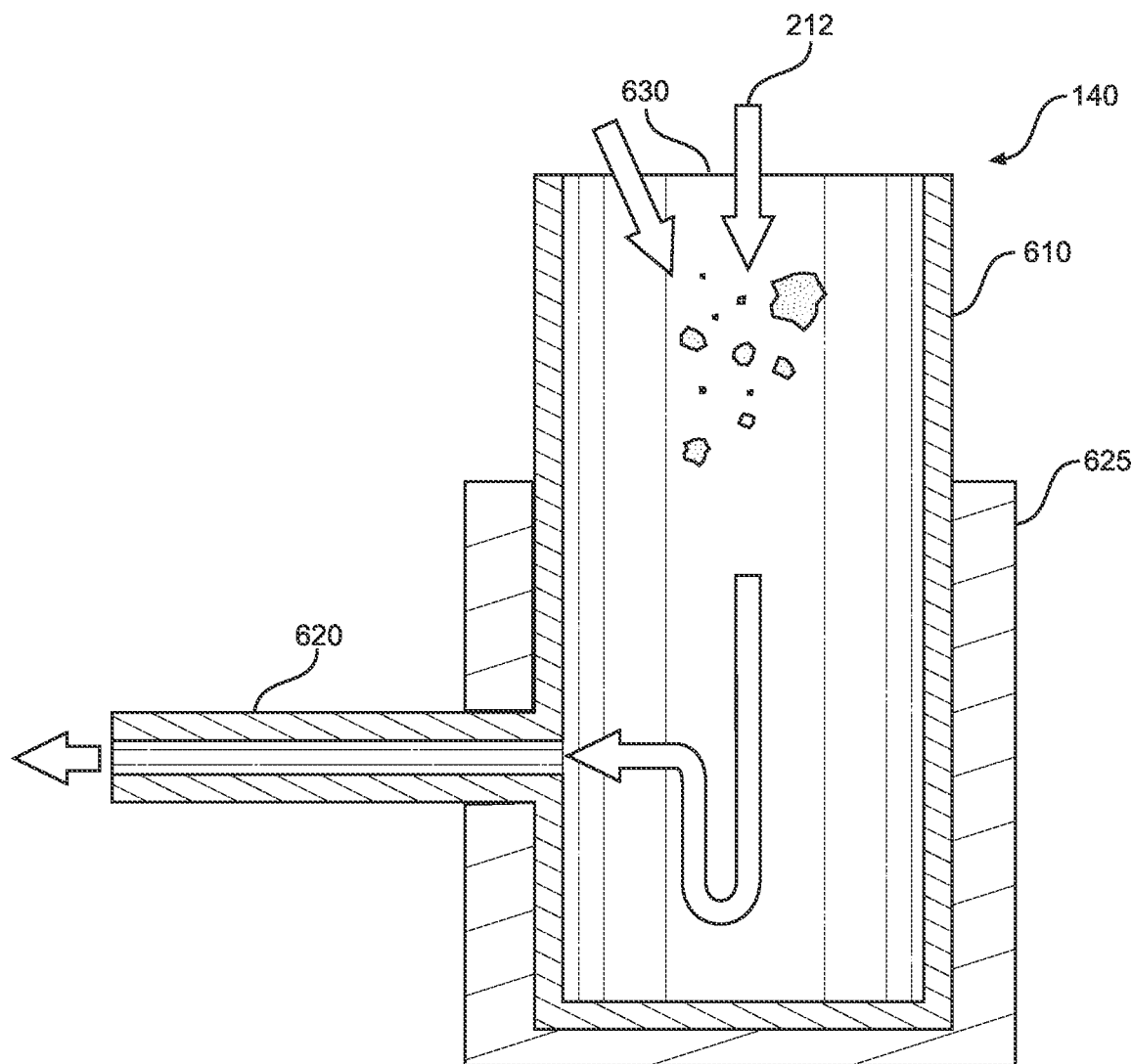
FIG. 6 shows an exemplary evaporator assembly.

The evaporator assembly 140 is shown in FIG. 6 and may comprise a glass or stainless-steel vertical tube 610 capped at the bottom with a side horizontal outlet tube 620. The side walls and the bottom of evaporator may typically be heated by resistive heaters 625, heat tape or an immersion bath. The precursor powder 212 component or mixture of two or more precursors, coming out of the feeder feed screw 220 (see FIGS. 1 and 2) outlet 340 falls down into the evaporator 610 under the force of gravity and convection forces from the flow of a carrier gas 630. Carrier gas 630 may be injected into the system at a number of places, for example at the evaporator as shown or up or downstream. Suitable carrier gasses may include argon, nitrogen or other gas that is preferably inert. The design and operating parameters of the evaporator are optimized for consistent continuous operation and full evaporation of the precursors without decomposition while leaving no or minimal residue in the evaporator.

Figure 7:
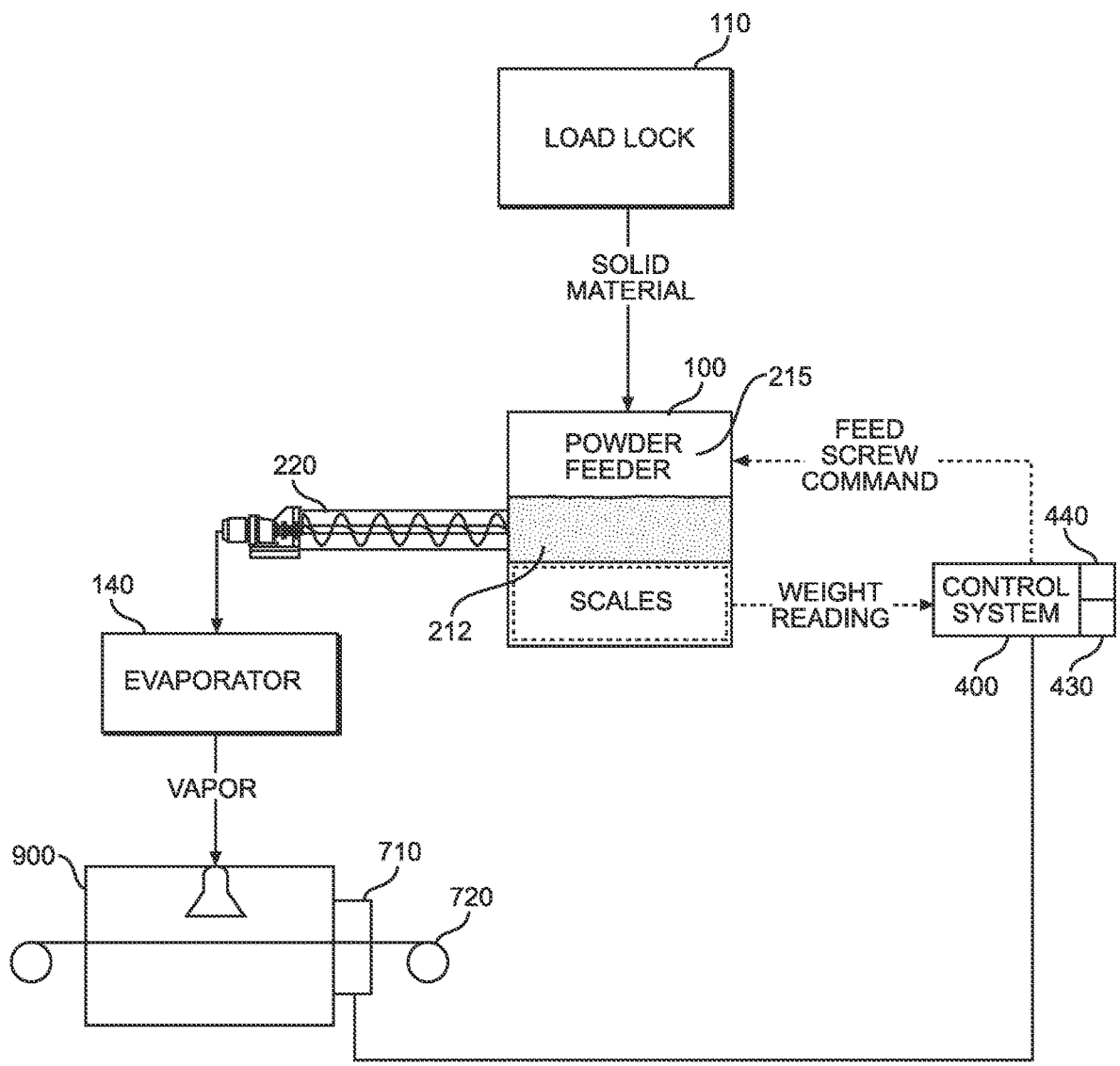
FIG. 7 shows an exemplary powder feed and reactor system.

In other embodiments the calculated feed rate 460 of precursor material 212 calculated by the control system 400 may incorporate other and/or additional process related inputs. For example, as shown in FIG. 7, a deposited layer thickness and growth rate of a thin film can be measured and monitored as the deposition process is conducted in real time (within the reactor) or near real time (measurement outside the reactor). The reactor 900 may be a Photo-Assisted MOCVD (PAMOCVD) reactor to be discussed in greater detail below and in reference to FIG. 9. Techniques known in the art for in situ measurements of thin film thickness with good experimental error include X-Ray Fluorescence (XRF) among others. In these embodiments, a thin film metric of the deposited layer on a substrate 720 within reactor 900 is measured and outputted from an XRF device 710 (near real time, outside reactor shown) and is processed by the data processing algorithm 430 of control system 400 as a second process variable to check and adjust the conversion of the weight loss curve to the calculated feed rate. In certain other embodiments, the layer thickness may directly control the feed screw 220 speed/rate 540 via the PID loop 440 with or without the weight input variable. In other embodiments, elemental composition of the coating may be measured e.g. by XRF or indirectly by XRD and can serve as an input to the control system 400. Also, the mass flow of precursor vapor (for example, as a partial pressure of precursor vapor, or a precursor vapor pressure) can be measured e.g. by gas phase IR optical absorption spectroscopy or by mass spectroscopy and can serve as an input or as a secondary or auxiliary input. These and other additional inputs may particularly apply in a multi vapor source setup (each individual precursor fed and evaporated separately) where composition of the vapor/coating can potentially be tuned on the fly based on in-process control variables and inputs such as these. In this manner, the feed rate may be directly controlled by the process variable, or the process variable may serve as a secondary check upon the gravimetric system described herein.

Performance of the powder feed system is critical for the overall vapor generation process and the quality of the deposited thin film coatings, including and particularly high-temperature superconductors (HTS). Variations in precursor feed rate can lead to changes in precursor vapor flow into the deposition zone of a HTS reactor which in turn may cause inconsistent deposited layer thickness, variable and low growth rate and reduced critical current (Ic) performance of a high-temperature superconductor REBCO coating.

Figure 8:
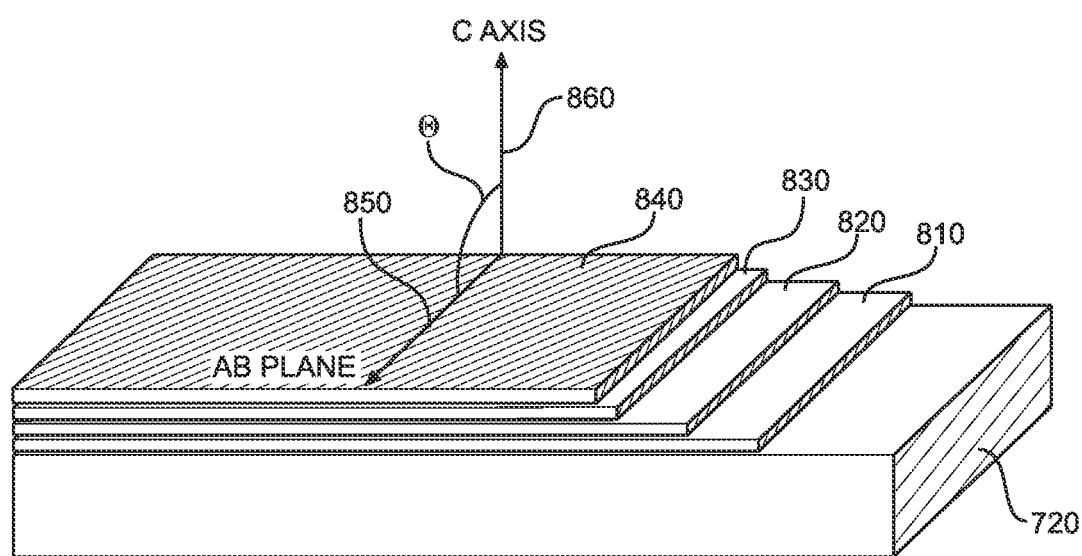
FIG. 8 shows an exemplary architecture of a high-temperature superconductor.

The epitaxial REBCO high temperature superconductor (HTS) wire is processed in certain preferred embodiments by using Metal Organic Chemical Vapor Deposition (MOCVD), Photo-Assisted Metal Organic Chemical Vapor Deposition (PAMOCVD) or other suitable deposition process known in the art of superconductor fabrication. The HTS wire or tape typically has a thin film composite architecture, an example of which is shown in FIG. 8. In this example, the architecture includes a substrate 720, at least one buffer layer (two are shown in this example as 810 and 820), at least one superconducting layer (one is shown in this example as 830), and at least one capping or stabilizing layer 840. Other layers are readily contemplated by those skilled in the art and may provide additional purpose to the basic architecture described herein.

The high-temperature superconducting (HTS) layer 830 is typically comprised of HTS materials known in the art capable of generating superconducting behavior at 77K or below which corresponds to the boiling temperature of liquid nitrogen under normal pressure. Suitable materials may include $YBa_2Cu_3O_{7-x}$ (YBCO) or $Bi_2Sr_2CaCu_2O_{8+x}$ (BSCCO) among others. Other stoichiometries of YBCO are known, including but not limited to $Y_2Ba_4Cu_7O_{14+x}$, $YBa_2Cu_4O_8$ and others, which are also contemplated by the present disclosure and which are generally and henceforth will be referred to as YBCO material. In other embodiments, other rare earth (RE) elements may be substituted in place of Y, generally referred to as the family of materials $REBa_2Cu_3O_{7-x}$ (REBCO) where RE may include Y, La, Nd, Sm, Eu, Gd, Tb, Dy, Ho, Er, Tm, Yb or Lu.

Certain embodiments of REBCO HTS superconductor tapes and wires of the present invention may also include nano-sized particles distributed within the a-b plane of the superconducting layer of the wire to provide high Ic at high magnetic fields. Co-pending PCT Application PCT/US19/55745, also assigned to the present Applicant, discloses flux pinning of HTS materials and is incorporated herein for all purposes. In the context discussed herein, said particles within the a-b plane shall mean within the plane that is coplanar to the superconducting layer 830 as shown in FIG. 8. In certain preferred embodiments, the orientation of the pinning particles is within the a-b plane 850 of the HTS layer 830 in contrast to pinning centers aligned with the c-axis 860, which corresponds to a direction out of the page in FIG. 8.

Deposition based biaxial texturing of the buffer layer or layers (810, 820) may be achieved via Ion Beam Assisted Deposition (IBAD), Pulsed Laser Deposition (PLD), or Inclined Substrate Deposition (ISD) or other methods. The biaxially textured film may have a rock salt (halite) like crystal structure. The biaxial texturing is necessary for proper crystallographic alignment of the REBCO superconductor layer when deposited upon the substrate 800 for optimum superconducting performance. The buffer material may be specified to ensure a desired lattice mismatch between the buffer (810, 820) and the REBCO HTS layer 830 to foster development of the nanoparticles for flux pinning.

For second generation (2G) high temperature superconductors (HTS), the flux pinning force is related to the density, size and dimensionality of the defects introduced. In preferred embodiments, the non-superconducting flux pinning particles are randomly dispersed within the superconducting layer. The material composition of the non-superconducting flux pinning sites can include but are not limited to $RE_2O_3$ and $BaMO_3$. For $RE_2O_3$, RE may include Y, La, Nd, Sm, Eu, Gd, Tb, Dy, Ho, Er, Tm, Yb or Lu. In the case of $BaMO_3$, $BaMO_3$ nanoparticle formation in REBCO requires the additional element of M where M includes one or more of the following elements: Ti, Zr, Al, Hf, Ir, Sn, Nb, Mo, Ta, Ce, and V.

The size of the non-superconducting flux pinning particles can range up to 100 nm or larger in diameter. $RE_2O_3$ nanoparticles form within the a-b planes of the REBCO layer without the need of additional elements beyond those typically contained in the precursor vapor source for growing REBCO superconducting material. Thus, in preferred embodiments, the non-superconducting flux pinning particles are co-deposited with the superconducting material without introduction of foreign material. It is a further feature of the presently disclosed superconducting wire and fabrication methods that the particles lack a substantial c-axis orientation. The formation of these a-b plane distributed nanoparticles can be achieved in certain preferred embodiments using a Photo-Assisted Metal Organic Chemical Vapor Deposition (PAMOCVD) process without reducing the growth rate as commonly occurs with other growth methods that yield preferentially vertically orientated nanoparticles.

Figure 9:
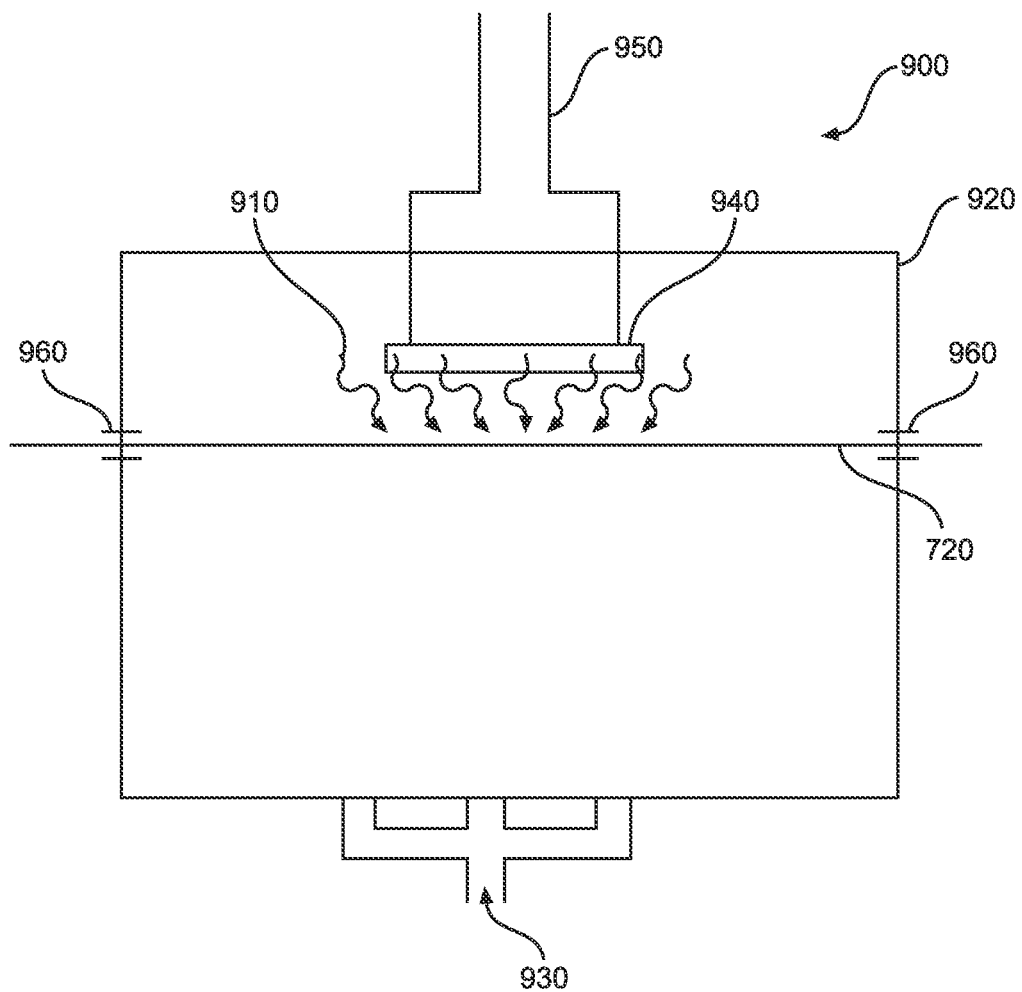
FIG. 9 shows an exemplary PAMOCVD reactor.

FIG. 9 shows an exemplary PAMOCVD reactor 900 and system whereby the application of UV and visible light provides the energetic source to the reaction process which may be assisted by thermal radiation to increase the mobility of the incoming atoms to form the superconducting material as well as the non-superconducting nanoparticles during the deposition and distribution of both non-superconducting and superconducting material. The UV/visible radiation source 910 is typically enclosed within or may be located outside of a low-pressure reaction chamber or vessel 920 maintained at a target pressure by one or more external vacuum pumps 930. The source 910 may be comprised of one or more lamps emitting a desired wavelength or range of wavelengths toward the substrate 720. The lamps may be arranged in the reactor adjacent to or in proximity to the inlet showerhead 940 or may be external to the reactor and focused through a window toward the substrate 720 below the showerhead which provides injection of precursor 212 from a feed line 950 for the precursor starting material. The source 910 is typically focused onto the growth surface of the moving metallic foil substrate 720. Such substrate is commonly provided in a reel to reel continuous feed system with the substrate passing through slits 960 in the walls of the reaction vessel 920.

Exemplary YBCO HTS material with non-superconducting flux pining centers can be produced by MOCVD from a solid precursor feed comprising the following: Y precursor as Yttrium tris(2,2,6,6-tetramethyl-3,5-heptanedionate) ($YC_{33}H_{57}O_6$, or abbreviated as $Y(THD)_3$); Ba precursor as Barium bis(2,2,6,6-tetramethyl-3,5-heptanedionate) ($BaC_{22}H_{38}O_4$, or abbreviated as $Ba(THD)_2$), and Cu precursor as Copper bis(2,2,6,6-tetramethyl-3,5-heptanedionate) ($CuC_{22}H_{38}O_4$ or abbreviated as $Cu(THD)_2$), where THD is typically an "anion" of 2,2,6,6-tetramethyl-3,5-heptanedion ($C_{11}H_{20}O_2$), and thus THD is $C_{11}H_{19}O_2$.

The REBCO deposition surface in certain preferred embodiments is continually irradiated by the UV/visible radiation flux from the radiation source 910 while the REBCO film is growing with the radiation striking the tape substrate onto which a REBCO film is being grown at a substantially normal incident angle as shown in FIG. 9. Normal orientation of radiation yields the highest radiation density at the surface as any off-normal radiation configuration yields a lower radiation density. When a radiation source or sources 910 are arranged in a hemispherical pattern around the inlet showerhead 940, the exposure may have both perpendicular and non-zero angular radiation striking the surface.

UV/visible radiation at the surface of the growing film may energetically excite surface atoms to enhance their surface mobility thus allowing for more rapid attainment of their lowest energy configuration consequently yielding highly crystalline structure for the growing film. It is this highly crystalline structure in the a-b plane (i.e. predominantly within the plane of the substrate) for REBCO that promotes high current capacity and high performance. Further, the localization of the energy which is promoting growth of the REBCO film at the growth surface by supplying the energy from above the growing film eliminates any thermal lag associated with supply of energy from below the tape substrate as in the use of typical heated substrate susceptors.

The UV/visible radiation present at the growth surface of the growing REBCO layer greatly enhances the growth rate of highly textured REBCO. Rates of 1.2 microns/min (μm/min) or higher are possible while maintaining the high-performance quality of the REBCO tape. The high growth rates are proposed to be due to physico-chemical effects including the mentioned surface diffusion enhancement of the alighting elements forming the REBCO unit cell on the buffer layer surface. Enhancing diffusion of the atoms by UV/Visible radiation as they alight onto the growth surface allows for more rapid movement of atoms to their lowest energy positions on the surface, and hence higher growth rates.

As stated above, the direct radiation exposure of the growth surface results in REBCO (for example, YBCO) films that can be grown with high crystalline order and at rates of 1.2 μm/min or higher, and as low as 0.01 μm/min, if desired. The REBCO films are grown with a high degree of crystalline order or texturing as defined by x-ray diffraction parameters of $\Delta\phi$ between 2° and 7°, and $\Delta\omega$ between 1° and 4° in certain preferred exemplary embodiments. The performance of the resulting exemplary YBCO wires or tapes as measured by their current carrying capacity may exceed 500 A/cm-width or higher at 77K. Such performance, and high growth rates allow for industrial production of high performance REBCO wire with commercially attractive economics.

In preferred embodiments, the flow rates and stoichiometry of the starting precursor material is highly controlled in order to co-produce $RE_2O_3$ or $BaMO_3$ nanoparticles in the REBCO film for flux pinning. The growth rate is adjusted by precise control of precursor flow rates, and source energy inputs to ensure proper quantity, size and distribution of nanoparticles. Additionally, the stoichiometry of MOCVD precursor vapor contributes to the determination of the composition of the secondary phase non-superconducting particles which act as the pinning centers. The non-superconducting particles of the present invention may in certain embodiments be generated by adding an excess of RE precursor or excess of Ba and by introducing new M precursor into the vapor flow. Hence, the solid precursor feed system of the present disclosure significantly aids the accurate and precisely controlled delivery of HTS precursors to the deposition zone of the reactor.

Figure 10:
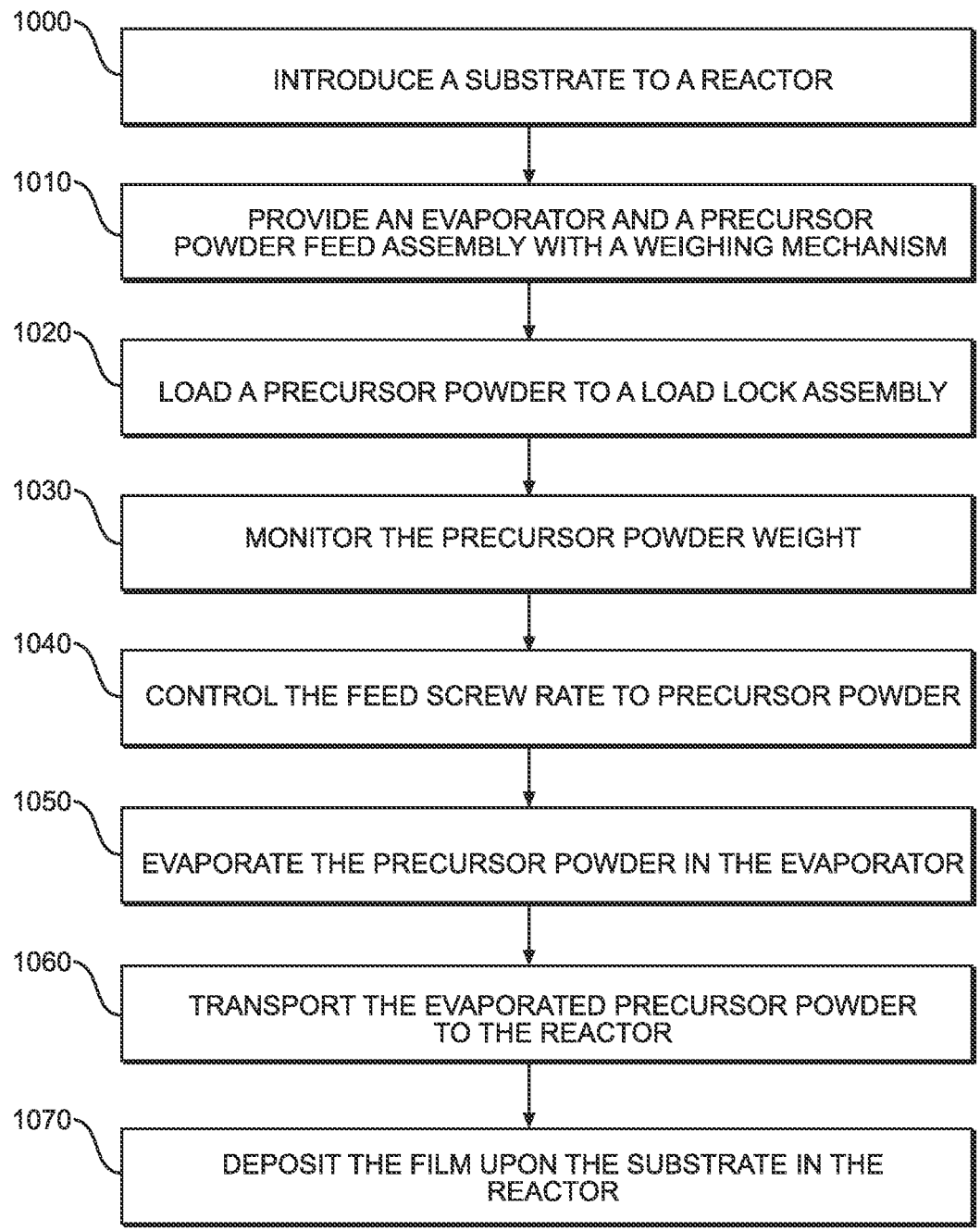
FIG. 10 shows an exemplary method for manufacturing a high-temperature superconductor.

A method for manufacturing a high temperature superconductor utilizing a solid precursor feed system is now discussed with regard to FIG. 10. The method includes in step 1000 introducing a substrate 800 to a reactor 900 provided as part of a system that further includes as step 1010 providing an evaporator 140 operatively coupled to a precursor powder feed assembly 100 that comprises a screw feed device 220 and a precursor powder vessel 215 coupled to a weighing mechanism 120. In step 1020, precursor powder 212 is loaded into a load lock assembly 110 that is configured to supply the precursor powder 212 to the precursor powder feed assembly 100, wherein the precursor powder 212 is comprised of at least one component of a high temperature thin film superconductor layer. Step 1030 includes using a control system 400 to monitor the precursor powder vessel 215 weight, and in step 1040, using that weight to control the feed screw 220 rate based upon the powder vessel weight 215 in order to provide a target precursor powder feed rate to the evaporator 140. In step 1060, the evaporator 140 evaporates the precursor powder 212 in the evaporator 140 which is transported in step 1060 by a carrier gas into the reactor 900 and deposited in step 1070 as a thin film upon the substrate 800 in the reactor 900.

In one exemplary embodiment, $Y_2O_3$ non-superconducting particles are formed in the YBCO as flux pining centers via PAMOCVD processing utilizing a precursor mixture with 20 atomic % excess Yttrium precursor. The deposition growth rate of HTS material in this example was approximately 0.2 μm/min upon a $CeO_2$ capped IBAD buffered substrate. In another embodiment YBCO is deposited with 40 atomic % excess Yttrium precursor. The deposition growth rate of HTS material in this example was approximately 0.25 μm/min upon a $LaMnO_3$ capped IBAD buffered substrate.

An important performance metric for the HTS wire is to attain high critical current with the wire containing nanoparticles in the HTS layer for flux pinning which are distributed along a-b planes in the HTS layer with no specific vertical or near vertical alignment. Critical currents greater than 450 A/cm-width and 0.11 mm total HTS wire thickness can be obtained at 4K and 19 T when the magnetic field is perpendicular to the tape surface (H//c).

The performance of the HTS wire in a magnetic field is also often characterized by a measure commonly referred to as Lift Factor. The Lift Factor is typically defined as the ratio between the critical current at 77K, self-field and that at a separate temperature and field such as 4K and 20 T. Unlike the critical current, which is an absolute value, the Lift Factor provides the relative relation of the two values. The wires of certain exemplary embodiments of the present disclosure have demonstrated lift at 4K, 20 T (Ic (4K, 20 T)/Ic (77K, self-field)), which corresponds to a Lift Factor of 2 or greater.

The ability to maintain high critical current performance at high growth rate is crucial towards commercial viability of HTS products. The thickness of the REBCO superconductor layer can be defined by the growth rate of the REBCO multiplied by the deposition time where growth rates can be 0.2 µm/min, 1.0 µm/min, 1.2 µm/min, 1.5 µm/min and higher while retaining high flux pinning resulting in critical currents (Ic) above 450 A/cm-width at 4K and 20 T and a corresponding engineering critical current density JE of 40,000 A/cm$^2$ or greater, where the engineering critical current density JE is defined as the critical current Ic divided by the total cross-sectional area of the HTS wire.

An example of the performance of the powder feed system for HTS fabrication is shown in FIG. 11. In this plot, the HTS wire performance in terms of critical current Ic 1120 at various longitudinal positions along the tape (x-axis 1110) is overlaid with the feed system controller variables. Thus, in this depiction, one can view the magnitude and variability of a tape output or performance characteristic as a function of the control system factors operating at the time of deposition for particular tape locations. The top line 1120 gives the tape critical current Ic (A/cm-width). Referring also back to the discussion earlier with regards to FIGS. 3-5; line 1140 of FIG. 11 gives the weight reading 415 (as either the actual powder 212 weight or tared powder vessel 215 weight) while the load lock assembly undergoes a reloading or recharge of precursor powder. Line 1150 gives the solid precursor feed rate 460 calculated by the control system 400 as a function of the weight reading 415 while line 1160 shows the feed screw 220 speed setting 540.

What is claimed is:

1. A precursor powder feed system for deposition of thin films, the system comprising:
    a powder vessel maintained under vacuum for housing a precursor powder;
    a load lock assembly located outside the powder vessel and comprising a pressure isolated chamber for reloading the powder vessel, wherein a plurality of gas control valves and a gate valve pressure isolate the load lock assembly from the powder vessel to provide for addition of powder precursor while the feed system operates continuously, and a flow control orifice to equalize pressure between the load lock assembly and powder vessel;
    a scale coupled to the powder vessel and configured to provide continuous mass data of precursor powder in the powder vessel;
    a mechanically driven powder feeder coupled to the powder vessel and configured to receive powder from the powder vessel; and
    an evaporator configured to receive the powder from the powder feeder and evaporate the powder.

2. The system of claim 1, further comprising a motor driven agitator located within the powder vessel and configured to provide powder mixing and distribution.

3. The system of claim 1, wherein the evaporator further comprises an outlet screen.

4. The system of claim 1, wherein the powder feeder is a feed screw.

5. The system of claim 1, further configured for injection of an inert carrier gas.

6. The system of claim 1, further comprising a control system having a PID controller with a data processor configured to control the powder feeder to deliver a target precursor powder feed rate to the evaporator based on the continuous mass data from the scale.

7. The system of claim 1, further comprising a control system having a PID controller with a data processor configured to control at least one of the plurality of gas control valves of the load lock assembly.

8. The system of claim 1, further comprising a control system having a PID controller with a data processor configured to control at least one of the plurality of gas control valves of the load lock assembly and the powder feeder to deliver a target precursor powder feed rate to the evaporator based on the continuous mass data from the scale.

9. The system of claim 1, wherein the precursor powder is comprised of more than one thin film component.

\* \* \* \* \*